United States Patent
Wang et al.

(10) Patent No.: US 9,093,179 B2
(45) Date of Patent: Jul. 28, 2015

(54) CHIP CAPABLE OF IMPROVING TEST COVERAGE OF PADS AND RELATED METHOD THEREOF

(71) Applicant: Etron Technology, Inc., Hsinchu (TW)

(72) Inventors: Shih-Hsing Wang, Hsinchu (TW); Ming-Cheng Liang, Hsinchu County (TW); Kuo-Cheng Ting, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 212 days.

(21) Appl. No.: 13/865,206

(22) Filed: Apr. 18, 2013

(65) Prior Publication Data
US 2014/0075251 A1   Mar. 13, 2014

(30) Foreign Application Priority Data
Sep. 11, 2012 (TW) .............................. 101133168 A

(51) Int. Cl.
*G11C 29/12* (2006.01)
*G11C 29/02* (2006.01)

(52) U.S. Cl.
CPC .............. *G11C 29/12* (2013.01); *G11C 29/022* (2013.01); *G11C 29/1201* (2013.01)

(58) Field of Classification Search
CPC ................. H01L 22/34; H03K 19/003; G01R 31/31707; G01R 31/318536; G01R 31/318541; G01R 31/318572; G01R 31/2884; G11C 29/12; G11C 29/56; G11C 29/40; G11C 29/44; G11C 29/10; G11C 29/38; G11C 29/48; G11C 29/50; G11C 29/14
USPC .................. 714/718, 719, 726, E11.145, 738; 365/201, 230.03
See application file for complete search history.

(56) References Cited

U.S. PATENT DOCUMENTS

| | | | | |
|---|---|---|---|---|
| 5,091,692 A | * | 2/1992 | Ohno et al. | 324/750.23 |
| 5,506,499 A | * | 4/1996 | Puar | 324/754.03 |
| 6,577,980 B1 | * | 6/2003 | Shepston et al. | 702/117 |
| 6,907,376 B2 | * | 6/2005 | Shepston et al. | 702/117 |
| 7,979,758 B2 | * | 7/2011 | Hur et al. | 714/718 |
| 2005/0085932 A1 | * | 4/2005 | Aghababazadeh et al. | 700/90 |

* cited by examiner

*Primary Examiner* — Phung M Chung
(74) *Attorney, Agent, or Firm* — Winston Hsu; Scott Margo

(57) ABSTRACT

A method for improving test coverage of pads of a chip, where the chip includes a control unit, a plurality of pads, and a storage unit, and the storage unit includes a plurality of blocks, includes writing test data to a first predetermined block through a predetermined pad of the plurality of pads, controlling a first pad to read and store a predetermined datum of the test data from the first predetermined block, controlling the first pad to write the predetermined datum to a second predetermined block, reading the predetermined datum stored in the second predetermined block through the predetermined pad, and determining whether the first pad is passed.

15 Claims, 8 Drawing Sheets

CHIP CAPABLE OF IMPROVING TEST COVERAGE OF PADS AND RELATED METHOD THEREOF

BACKGROUND OF THE INVENTION

1. Field of the Invention

The present invention relates a chip capable of improving test coverage of chip pads and a method capable of improving test coverage of chip pads, and particularly to a chip and a method that can utilize a controller to control a pad not coupled to a probe to read/write a predetermined datum to improve test coverage of chip pads.

2. Description of the Prior Art

Please refer to FIG. 1 and FIG. 2. FIG. 1 is a diagram illustrating a probe 100 of a test machine utilizing a data compression method to write test data TD to a chip 200 according to the prior art, and FIG. 2 is a diagram illustrating the probe 100 of the test machine utilizing the data compression method to read test data from the chip 200 according to the prior art. As shown in FIG. 1, the probe 100 writes the test data TD to a data path circuit 206 through a pad 202 and an off-chip unit 204. Then, the data path circuit 206 writes the test data TD to a storage unit 208 of the chip 200. As shown in FIG. 2, when the probe 100 utilizes the data compression method to read the test data from the chip 200, the probe 100 can read the test data from a corresponding block of the storage unit 208 through an exclusive-OR gate 210 and the data path circuit 206.

As shown in FIG. 1 and FIG. 2, a chip probing test of the prior art can cover the data path circuit 206, the storage unit 208, the pad 202, and the off-chip unit 204. However, the chip probing test of the prior art can not cover other pads and other off-chip units of the chip 200. That is to say, the chip probing test of the prior art can not determine whether other pads and other off-chip units of the chip 200 are passed.

SUMMARY OF THE INVENTION

An embodiment provides a chip capable of improving test coverage of chip pads. The chip includes a control unit, a plurality of pads, and a storage unit. A predetermined pad of the plurality of pads is used for coupling to a probe of a probe card, and the probe card is coupled to a test machine. The storage unit includes a plurality of blocks. The control unit controls a first pad of the plurality of pads to read and store a predetermined datum of test data from a first predetermined block, the control unit controls the first pad to write the predetermined datum to a second predetermined block of the plurality of blocks, the test machine controls the probe to read the predetermined datum stored in the second predetermined block through the predetermined pad, and the test machine determines whether the first pad is passed according to a read result.

Another embodiment provides a method capable of improving test coverage of chip pads. A chip includes a control unit, a plurality of pads, and a storage unit, where the storage unit includes a plurality of blocks. The method includes writing test data to a first predetermined block of the plurality of blocks through a predetermined pad of the plurality of pads; controlling a first pad of the plurality of pads to read and store a predetermined datum of the test data from the first predetermined block; controlling the first pad to write the predetermined datum to a second predetermined block of the plurality of blocks; reading the predetermined datum stored in the second predetermined block through the predetermined pad; and determining whether the first pad is passed according to a read result.

The present invention provides a chip capable of improving test coverage of chip pads and a method capable of improving test coverage of chip pads. The chip and the method utilize a controller to control a pad not coupled to a probe to read a predetermined datum, and utilize the controller to control the pad not coupled to the probe to write the predetermined datum to a predetermined block of a storage unit. Then, a test machine controls the probe to read the predetermined datum stored in the predetermined block through a predetermined pad, and records a read result corresponding to the pad not coupled to the probe. Therefore, the test machine can determine whether the pad not coupled to the probe is passed according to the read result. In addition, the test machine can also determine a leakage condition of the pad not coupled to the probe according to the read result corresponding to the pad not coupled to the probe.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
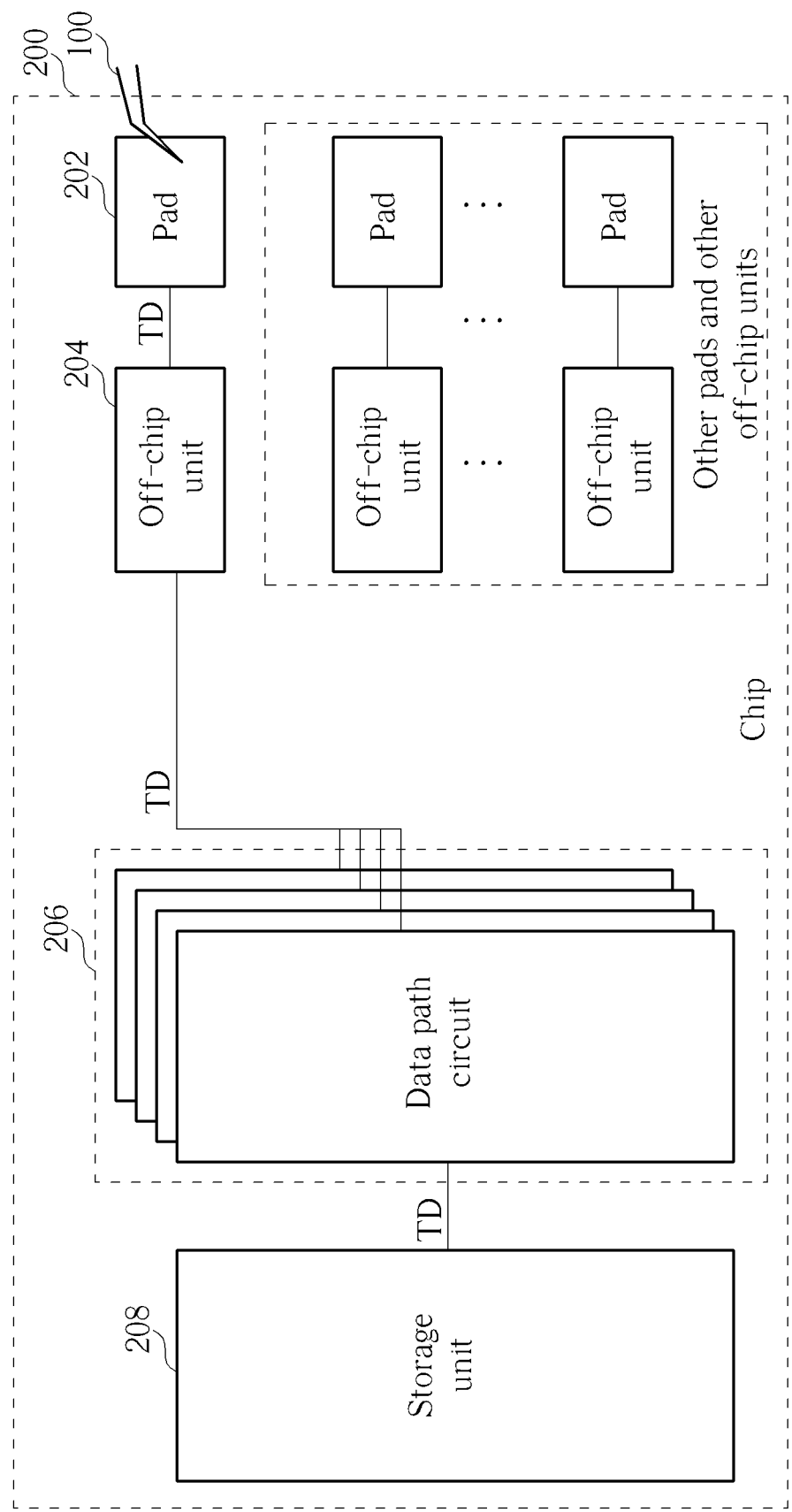
FIG. 1 is a diagram illustrating a probe of a test machine utilizing a data compression method to write test data to a chip according to the prior art.
Figure 2:
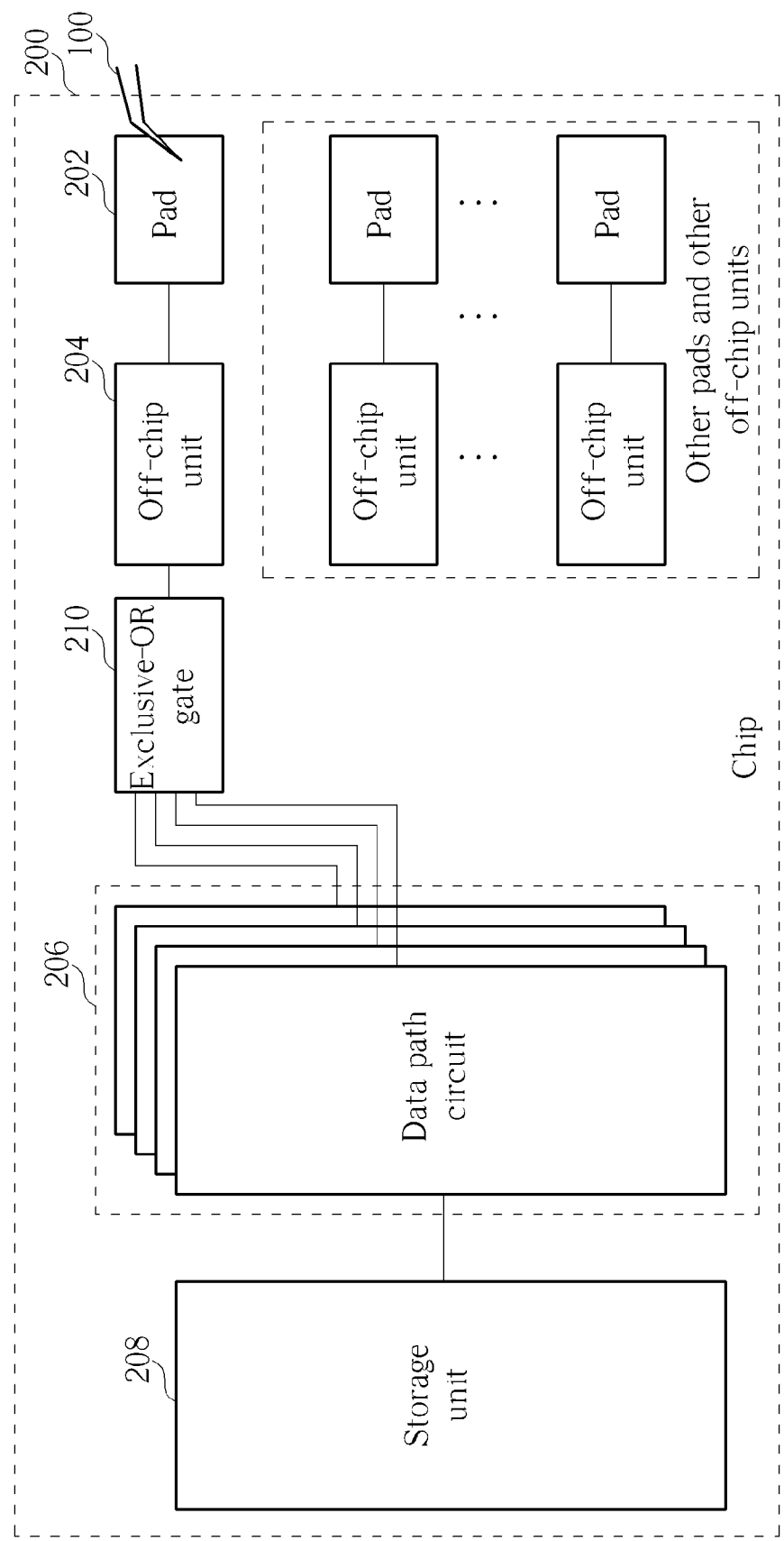
FIG. 2 is a diagram illustrating the probe of the test machine utilizing the data compression method to read test data from the chip according to the prior art.
Figure 3:
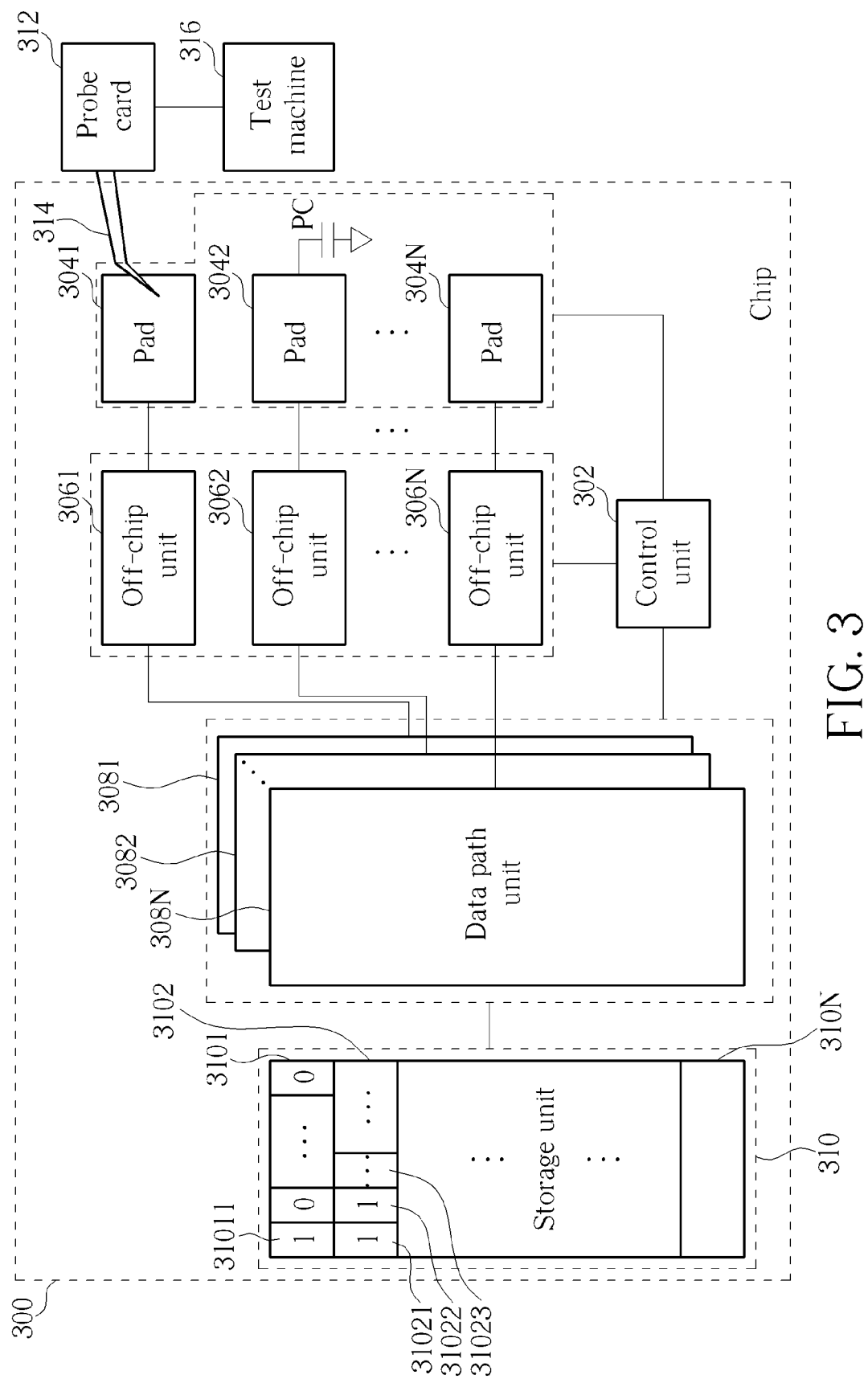
FIG. 3 is a diagram illustrating a chip capable of improving test coverage of chip pads according to an embodiment.

Please refer to FIG. 3. FIG. 3 is a diagram illustrating a chip 300 capable of improving test coverage of chip pads according to an embodiment. The chip 300 includes a control unit 302, a plurality of pads 3041-304N, a plurality of off-chip units 3061-306N, a plurality of data path units 3081-308N, and a storage unit 310, where N is a positive integer. As shown in FIG. 3, a predetermined pad 3041 of the plurality of pads 3041-304N is used for coupling to a probe 314 of a probe card 312, and the probe card 312 is coupled to a test machine 316. But, the present invention is not limited to the predetermined pad 3041 being coupled to the probe 314. That is to say, other pads of the plurality of pads 3041-304N can also be coupled to the probe 314. Each off-chip unit of the plurality of off-chip units 3061-306N is coupled between a data path unit and a pad. The storage unit 310 includes a plurality of blocks 3101-310N, and the storage unit 310 can be a memory array.

As shown in FIG. 3, the test machine 316 controls the probe 314 to write test data to the first predetermined block 3101 through the off-chip unit 3061 and the data path unit 3081 coupled to the predetermined pad 3041. For example, the test machine 316 controls the probe 314 to write logic "0" to all memory cells of the first predetermined block 3101 through the off-chip unit 3061 and the data path unit 3081 coupled to the predetermined pad 3041. Then, the test machine 316 controls the probe 314 to write a predetermined datum (e.g. logic "1") of test data to a memory cell 31011 of the first predetermined block 3101. But, the present invention is not limited to the test machine 316 controlling the probe 314 to write the test data to the first predetermined block 3101. That is to say, the test machine 316 can also control the probe 314 to write the test data to other blocks of the plurality of blocks 3101-310N. In addition, the present invention is also not limited to the above mentioned test data pattern.

Then, the control unit 302 controls a first pad 3042 of the plurality of pads 3041-304N to read and store the predetermined datum (the logic "1") from the memory cell 31011 of the first predetermined block 3101. That is to say, the first pad 3042 utilizes a parasitic capacitor PC thereof to store the predetermined datum (the logic "1"). After the first pad 3042 utilizes the parasitic capacitor PC thereof to store the predetermined datum (the logic "1"), the control unit 302 controls the first pad 3042 to write the predetermined datum (the logic "1") to all memory cells of a second predetermined block 3102 of the plurality of blocks 3101-310N. But, the present invention is not limited to the control unit 302 controlling the first pad 3042 to write the predetermined datum (the logic "1") to the memory cells of the second predetermined block 3102 in turn. That is to say, the control unit 302 can also control the first pad 3042 to write the predetermined datum (the logic "1") to other blocks of the plurality of blocks 3101-310N. Then, the test machine 316 can control the probe 314 to read the predetermined datum (the logic "1") stored in the second predetermined block 3102 through the predetermined pad 3041, and record a read result corresponding to the first pad 3042.

Figure 4:
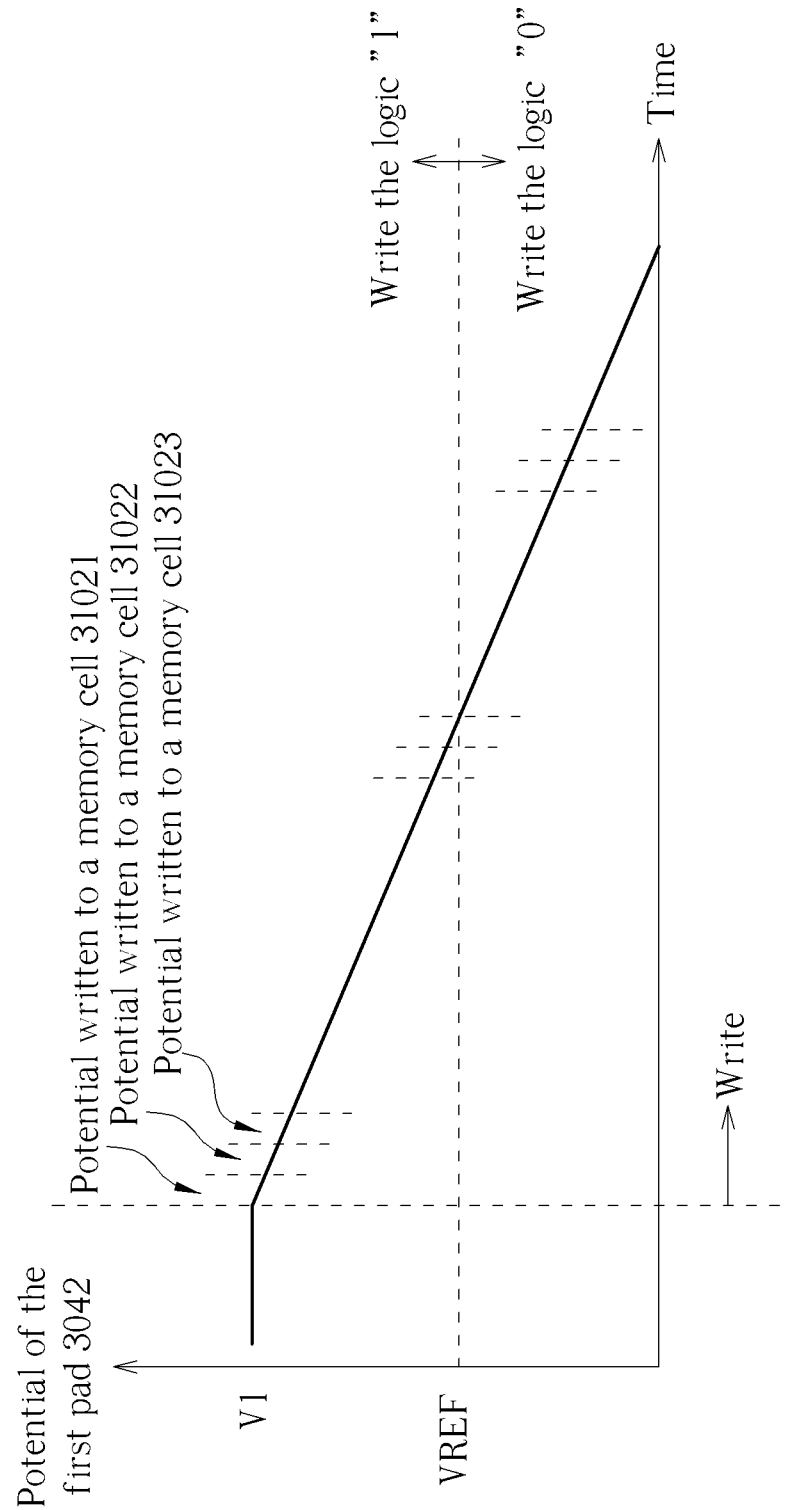
FIG. 4 is a diagram illustrating the read result corresponding to the predetermined datum stored in the first pad.

Please refer to FIG. 4. FIG. 4 is a diagram illustrating the read result corresponding to the predetermined datum (the logic "1") stored in the first pad 3042. As shown in FIG. 4, because the control unit 302 controls the first pad 3042 to write the predetermined datum (the logic "1") to the memory cells of the second predetermined block 3102 in turn, the test machine 316 can record gradually decrease potential stored in the memory cells of the second predetermined block 3102. That is to say, the first pad 3042 utilizes storing charges thereof corresponding to the predetermined datum (the logic "1") charges the memory cells of the second predetermined block 3102 in turn, so potential of the first pad 3042 can be gradually decreased, resulting in the potential stored in the memory cells of the second predetermined block 3102 being also gradually decreased. As shown in FIG. 4, when potential stored in a memory cell is lower than a reference voltage VREF, the test machine 316 determines that the memory cell stores the logic "0"; when potential stored in the memory cell is higher than the reference voltage VREF, the test machine 316 determines that the memory cell stores the logic "1". Therefore, the test machine 316 can determined whether the first pad 3042 is passed according to a read result shown in FIG. 4. That is to say, if the read result corresponding to the predetermined datum (the logic "1") stored in the first pad 3042 is not similar to the read result shown in FIG. 4, the test machine 316 can determined that the first pad 3042 is not passed. In addition, the test machine 316 can determine a leakage condition of the first pad 3042 according to the read result corresponding to the predetermined datum (the logic "1") stored in the first pad 3042 and equation (1):

$$Ileakage = \frac{Cm*(V1-VREF)}{TCK*M} \quad (1)$$

As shown in equation (1), Ileakage is a leakage current of the first pad 3042, Cm is a storage capacitance of each memory cell, V1 is potential corresponding to the logic "1", VREF is a reference voltage, TCK is time for writing data to each memory cell, and M is number of memory cells which stores the logic "1".

In addition, if the test machine 316 controls the probe 314 to write the logic "1" to the memory cells of the first predetermined block 3101 through the off-chip unit 3061 and the data path unit 3081 coupled to the predetermined pad 3041. Then, the test machine 316 controls the probe 314 to write a predetermined datum (e.g. the logic "0") of the test data to the memory cell 31011 of the first predetermined block 3101. But, the present invention is not limited to the above mentioned test data pattern. Then, the control unit 302 controls the first pad 3042 to read and store the predetermined datum (the logic "0") from the memory cell 31011. After the first pad 3042 utilizes the parasitic capacitor PC thereof to store the predetermined datum (the logic "0"), the control unit 302 controls the first pad 3042 to write the predetermined datum (the logic "0") to the memory cells of the second predetermined block 3102 in turn. But, the present invention is not limited to the control unit 302 controlling the first pad 3042 to write the predetermined datum (the logic "0") to the memory cells of the second predetermined block 3102 in turn. That is to say, the control unit 302 can also control the first pad 3042 to write the predetermined datum (the logic "0") to other blocks of the plurality of blocks 3101-310N. Then, the test machine 316 can control the probe 314 to read the predetermined datum (the logic "0") stored in the second predetermined block 3102 through the predetermined pad 3041, and record a read result corresponding to the first pad 3042.

Figure 5:
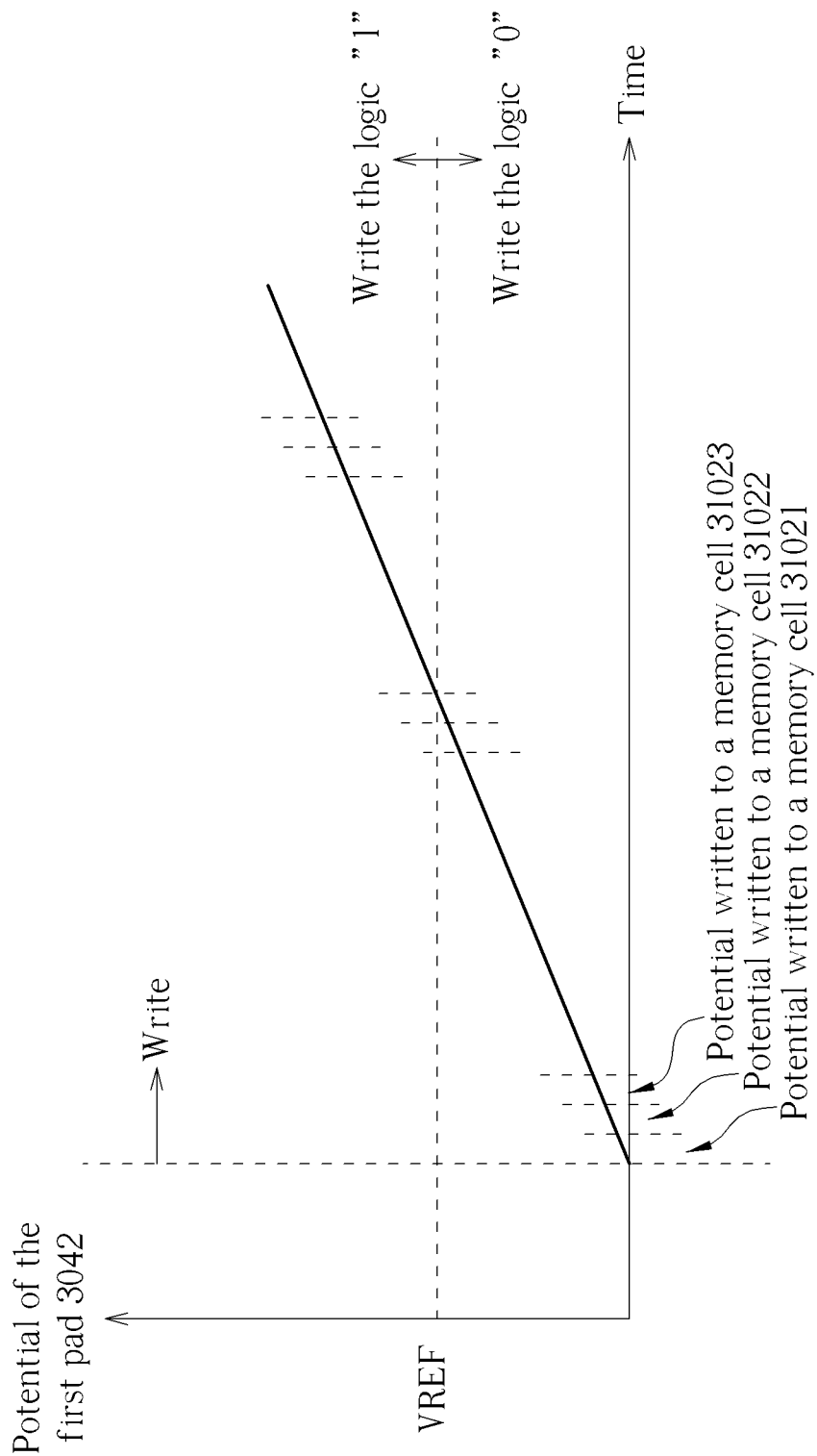
FIG. 5 is a diagram illustrating the read result corresponding to the predetermined datum stored in the first pad.

Please refer to FIG. 5. FIG. 5 is a diagram illustrating the read result corresponding to the predetermined datum (the logic "0") stored in the first pad 3042. As shown in FIG. 5, because the control unit 302 controls the first pad 3042 to write the predetermined datum (the logic "0") to the memory cells of the second predetermined block 3102 in turn, the test machine 316 can record gradually increase potential stored in the memory cells of the second predetermined block 3102. Therefore, as shown in FIG. 5, the test machine 316 can determine whether the first pad 3042 is passed according to a read result shown in FIG. 5. That is to say, if the read result corresponding to the predetermined datum (the logic "0") stored in the first pad 3042 is not similar to the read result shown in FIG. 5, the test machine 316 can determined that the first pad 3042 is not passed. In addition, the test machine 316 can further determine a leakage condition of the first pad 3042 according to the read result corresponding to the predetermined datum (the logic "0") stored in the first pad 3042 and equation (1).

In addition, the present invention can also test other pads of the plurality of pads 3041-304N according to the above mentioned method for testing the first pad 3042. In addition, the present invention can also simultaneously test the plurality of pads 3041-304N according to the above mentioned method for testing the first pad 3042.

Figure 6:
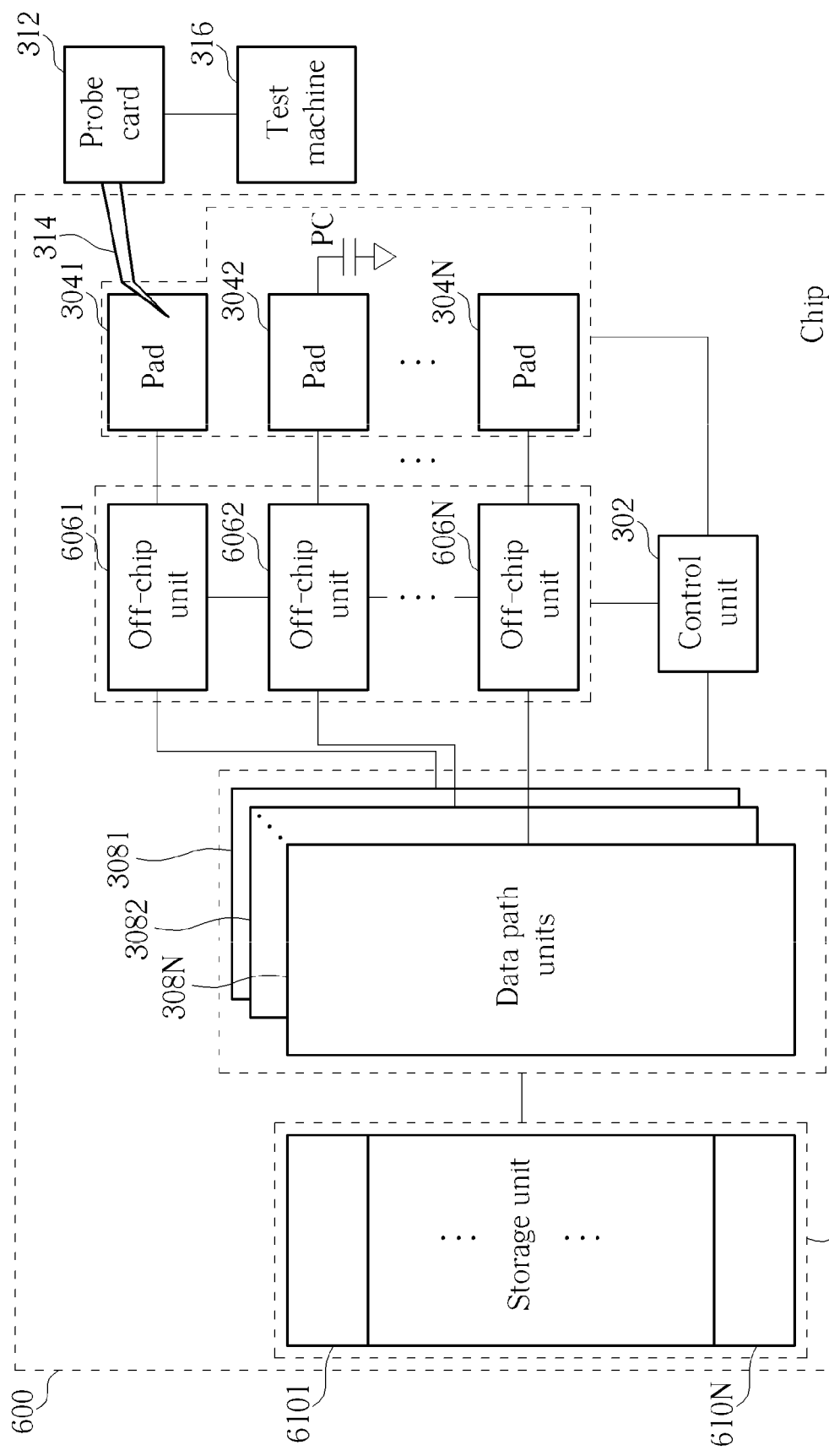
FIG. 6 is a diagram illustrating a chip capable of improving test coverage of chip pads according to another embodiment.

Please refer to FIG. 6. FIG. 6 is a diagram illustrating a chip 600 capable of improving test coverage of chip pads according to another embodiment. A difference between the chip 600 and the chip 300 is that a storage unit 610 included in the chip 600 is a logic circuit, and a plurality of off-chip units 6061-606N are coupled to each other. In addition, because the plurality of off-chip units 6061-606N are coupled to each other, the test machine 316 controls the probe 314 to write test data to the plurality of off-chip units 6061-606N through the predetermined pad 3041 according to a boundary scan method, where the boundary scan method is that the test data are written to the plurality of off-chip units 6061-606N in turn through a shift registering method. Then, the control unit 302 controls the plurality of off-chip units 6061-606N to write the test data to a first predetermined block 6101 of the storage unit 610 through the plurality of data path units 3081-308N. In addition, those skilled in the scope of the present invention can easily know that subsequent operational principles of the chip 600 are the same as those of the chip 300, so further description thereof is omitted for simplicity.

Figure 7:
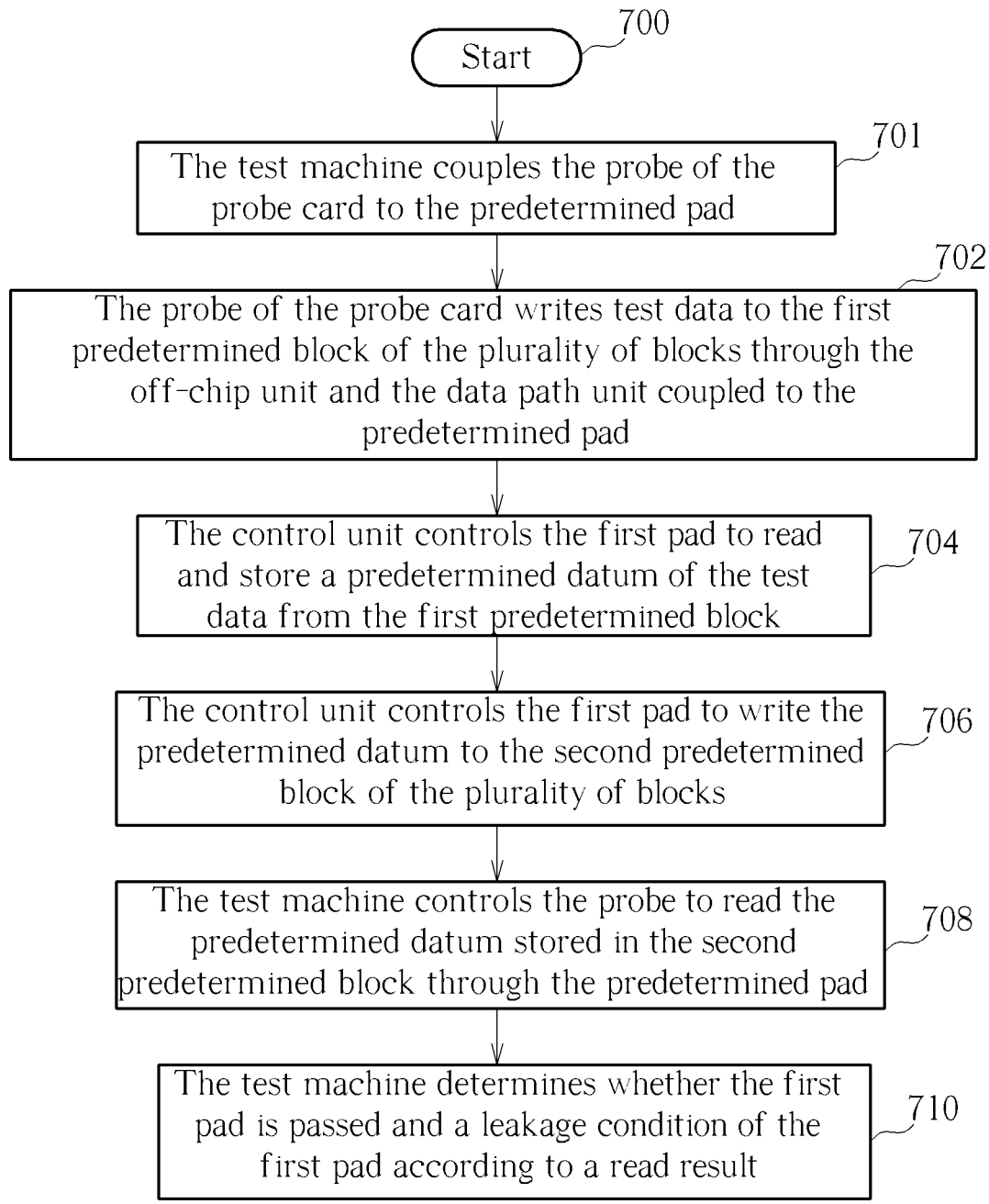
FIG. 7 is a method capable of improving test coverage of chip pads according to another embodiment.

Please refer to FIG. 3, FIG. 4, he FIG. 5, and FIG. 7. FIG. 7 is a method capable of improving test coverage of chip pads according to another embodiment. The method in FIG. 7 is illustrated using the chip 300 in FIG. 3. Detailed steps are as follows:

Step 700: Start.

Step 701: The test machine 316 couples the probe 314 of the probe card 312 to the predetermined pad 3041.

Step 702: The probe 314 of the probe card 312 writes test data to the first predetermined block 3101 of the plurality of blocks 3101-310N through the off-chip unit 3061 and the data path unit 3081 coupled to the predetermined pad 3041.

Step 704: The control unit 302 controls the first pad 3042 to read and store a predetermined datum of the test data from the first predetermined block 3101.

Step 706: The control unit 302 controls the first pad 3042 to write the predetermined datum to the second predetermined block 3102 of the plurality of blocks 3101-310N.

Step 708: The test machine 316 controls the probe 314 to read the predetermined datum stored in the second predetermined block 3102 through the predetermined pad 3041.

Step 710: The test machine 316 determines whether the first pad 3042 is passed and a leakage condition of the first pad 3042 according to a read result.

In Step 702, as shown in FIG. 3, the test machine 316 controls the probe 314 of the probe card 312 to write the test data to the first predetermined block 3101 of the storage unit 310 through the off-chip unit 3061 and the data path unit 3081 coupled to the predetermined pad 3041, where the storage unit 310 can be a memory array. For example, the test machine 316 controls the probe 314 to write logic "0" to the memory cells of the first predetermined block 3101 through the off-chip unit 3061 and the data path unit 3081 coupled to the predetermined pad 3041. Then, the test machine 316 controls the probe 314 to write a predetermined datum (e.g. logic "1") of the test data to the memory cell 31011 of the first predetermined block 3101. But, the present invention is not limited to the test machine 316 controlling the probe 314 to write the test data to the first predetermined block 3101. That is to say, the test machine 316 can also control the probe 314 to write the test data to other blocks of the plurality of blocks 3101-310N. In addition, the present invention is also not limited to the above mentioned test data pattern.

In Step 704, the control unit 302 controls the first pad 3042 to read and store the predetermined datum (the logic "1") from the memory cell 31011 of the first predetermined block 3101. That is to say, the first pad 3042 utilizes the parasitic capacitor PC thereof to store the predetermined datum (the logic "1"). In Step 706, after the first pad 3042 utilizes the parasitic capacitor PC thereof to store the predetermined datum (the logic "1"), the control unit 302 controls the first pad 3042 to write the predetermined datum (the logic "1") to the memory cells of the second predetermined block 3102 in turn. Then, in Step 708, the test machine 316 controls the probe 314 to read the predetermined datum (the logic "1") stored in the second predetermined block 3102 through the predetermined pad 3041, and record the read result corresponding to the first pad 3042.

In Step 710, as shown in FIG. 4, because the control unit 302 controls the first pad 3042 to write the predetermined datum (the logic "1") to the memory cells of the second predetermined block 3102 in turn, the test machine 316 can determined whether the first pad 3042 is passed according to the read result shown in FIG. 4. That is to say, if the read result corresponding to the predetermined datum (the logic "1") stored in the first pad 3042 is not similar to the read result shown in FIG. 4, the test machine 316 can determined that the first pad 3042 is not passed. In addition, the test machine 316 can determine the leakage condition of the first pad 3042 according to the read result corresponding to the predetermined datum (the logic "1") stored in the first pad 3042 and equation (1).

In addition, taking FIG. 5 as an example:

In Step 710, because the control unit 302 controls the first pad 3042 to write the predetermined datum (the logic "0") to the memory cells of the second predetermined block 3102 in turn, the test machine 316 can determine whether the first pad 3042 is passed according to the read result shown in FIG. 5. That is to say, if the read result corresponding to the predetermined datum (the logic "0") stored in the first pad 3042 is not similar to the read result shown in FIG. 5, the test machine 316 can determined that the first pad 3042 is not passed. In addition, the test machine 316 can further determine the leakage condition of the first pad 3042 according to the read result corresponding to the predetermined datum (the logic "0") stored in the first pad 3042 and equation (1).

Figure 8:
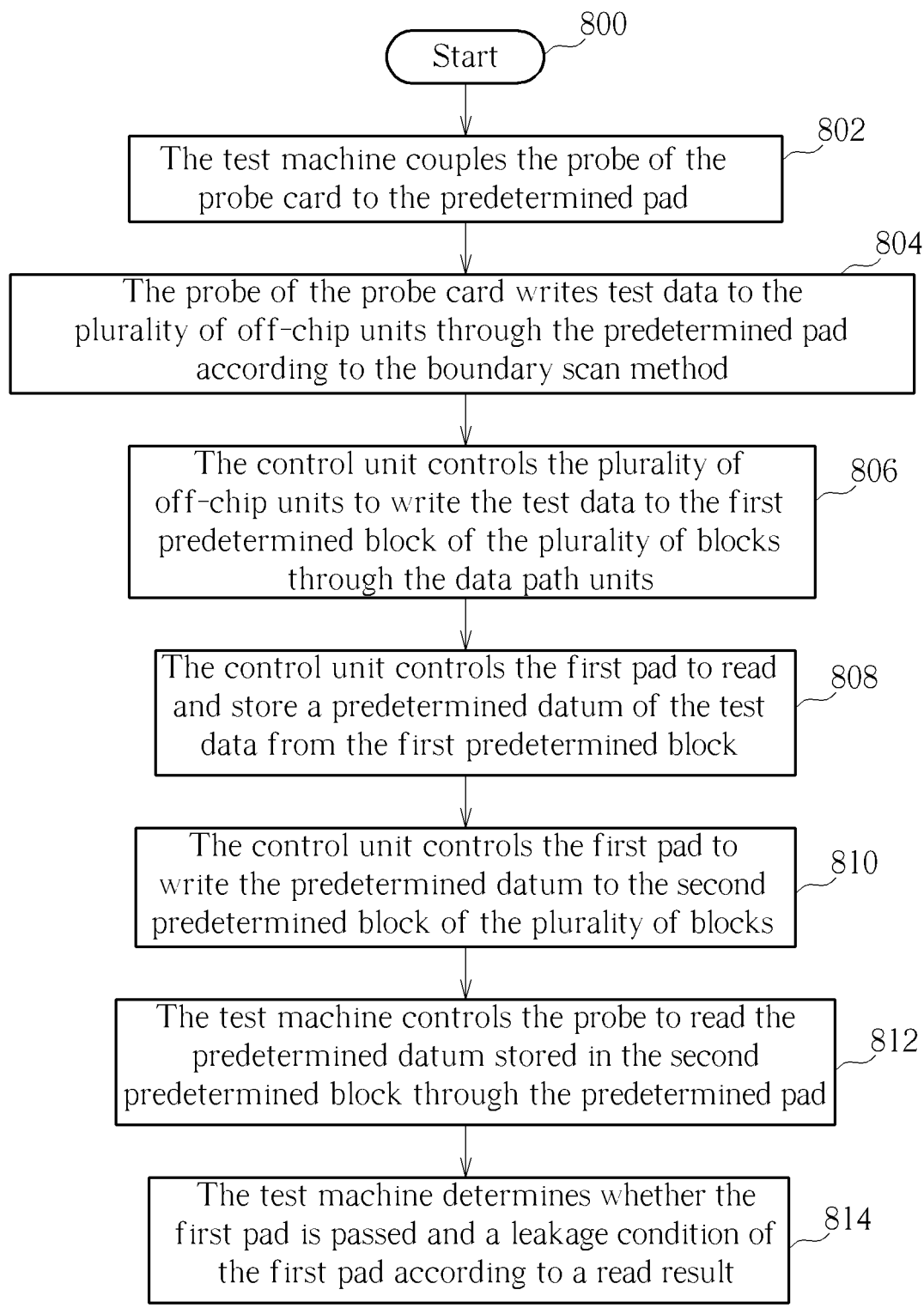
FIG. 8 is a method capable of improving test coverage of chip pads according to another embodiment.

Please refer to FIG. 6 and FIG. 8. FIG. 8 is a method capable of improving test coverage of chip pads according to another embodiment. The method in FIG. 8 is illustrated using the chip 600 in FIG. 6. Detailed steps are as follows:

Step 800: Start.

Step 802: The test machine 316 couples the probe 314 of the probe card 312 to the predetermined pad 3041.

Step 804: The probe 314 of the probe card 312 writes test data to the plurality of off-chip units 6061-606N through the predetermined pad 3041 according to the boundary scan method.

Step 806: The control unit 302 controls the plurality of off-chip units 6061-606N to write the test data to the first predetermined block 6101 of the plurality of blocks 6101-610N through the data path units 3081-308N.

Step 808: The control unit 302 controls the first pad 3042 to read and store a predetermined datum of the test data from the first predetermined block 6101.

Step 810: The control unit 302 controls the first pad 3042 to write the predetermined datum to the second predetermined block 3102 of the plurality of blocks 3101-310N.

Step 812: The test machine 316 controls the probe 314 to read the predetermined datum stored in the second predetermined block 3102 through the predetermined pad 3041.

Step 814: The test machine 316 determines whether the first pad 3042 is passed and a leakage condition of the first pad 3042 according to a read result.

A difference between the embodiment in FIG. 8 and the embodiment in FIG. 7 is that in Step 804, because the plurality of off-chip units 6061-606N are coupled to each other, the test machine 316 controls the probe 314 to write the test data to the plurality of off-chip units 6061-606N through the predetermined pad 3041 according to the boundary scan method, where the boundary scan method is that the test data are written to the plurality of off-chip units 6061-606N in turn through the shift registering method. Then, in Step 806, the control unit 302 controls the plurality of off-chip units 6061-606N to write the test data to the first predetermined block 6101 of the storage unit 610 through the plurality of data path units 3081-308N, where the storage unit 610 can be a logic circuit. In addition, those skilled in the scope of the present invention can easily know that subsequent operational principles of the embodiment in FIG. 8 are the same as those of the embodiment in FIG. 7, so further description thereof is omitted for simplicity.

To sum up, the chip capable of improving test coverage of chip pads and the method capable of improving test coverage of chip pads utilize the controller to control a pad not coupled to the probe to read a predetermined datum, and utilize the controller to control the pad not coupled to the probe to write the predetermined datum to a predetermined block of the storage unit. Then, the test machine controls the probe to read the predetermined datum stored in the predetermined block through a predetermined pad, and records a read result corresponding to the pad not coupled to the probe. Therefore, the test machine can determine whether the pad not coupled to the probe is passed according to the read result. In addition, the test machine can also determine a leakage condition of the pad not coupled to the probe according to the read result corresponding to the pad not coupled to the probe.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip for improving test coverage of pads, the chip comprising:
    a control unit;
    a plurality of pads, wherein a predetermined pad of the plurality of pads is used for coupling to a probe of a probe card, and the probe card is coupled to a test machine; and
    a storage unit comprising a plurality of blocks;
    wherein the control unit controls a first pad of the plurality of pads to read a predetermined datum of test data from a first predetermined block of the plurality of blocks and the first pad utilizes a parasitic capacitor thereof to store the predetermined datum, the control unit controls the first pad to write the predetermined datum to a second predetermined block of the plurality of blocks, the test machine controls the probe to read data stored in the second predetermined block through the predetermined pad and generate a read result accordingly, and the test machine determines whether the first pad is passed according to the read result.

2. The chip of claim 1, wherein the test machine further determines a leakage condition of the first pad according to the read result.

3. The chip of claim 1, wherein the storage unit is a memory array.

4. The chip of claim 1, further comprising:
    a plurality of off-chip units, wherein each off-chip unit is coupled to one pad of the plurality of pads; and
    a plurality of data path units, wherein each data path unit is coupled between one off-chip unit of the plurality of off-chip units and the storage unit.

5. The chip of claim 4, wherein the test machine further controls the probe to write the test data to the first predetermined block through an off-chip unit and a data path unit coupled to the predetermined pad.

6. The chip of claim 4, wherein the plurality of off-chip units are coupled to each other.

7. The chip of claim 6, wherein the storage unit is composed of logic circuits.

8. The chip of claim 7, wherein the test machine controls the probe to write the test data to the plurality of off-chip units in turn through the predetermined pad according to a boundary scan method, and the control unit controls the plurality of off-chip units to write the test data to the first predetermined block, wherein the boundary scan method is that the test data are written to the plurality of off-chip units in turn through a shift registering method.

9. A method for improving test coverage of pads of a chip, the chip comprising a control unit, a plurality of pads, and a storage unit, wherein the storage unit comprises a plurality of blocks, the method comprising:
    writing test data to a first predetermined block of the plurality of blocks through a predetermined pad of the plurality of pads;
    controlling a first pad of the plurality of pads to read a predetermined datum of the test data from the first predetermined block;
    controlling the first pad to write the predetermined datum to a second predetermined block of the plurality of blocks;
    reading data stored in the second predetermined block through the predetermined pad and generate a read result accordingly; and
    determining whether the first pad is passed according to the read result.

10. The method of claim 9, further comprising:
    determining a leakage condition of the first pad according to the read result.

11. The method of claim 9, wherein the storage unit is a memory array.

12. The method of claim 11, wherein writing the test data to the first predetermined block of the plurality of blocks through the predetermined pad of the plurality of pads comprises:
    a probe of a probe card writing the test data to the first predetermined block of the plurality of blocks through an off-chip unit and a data path unit coupled to the predetermined pad.

13. The method of claim 9, wherein the storage unit is a logic circuit.

14. The method of claim 13, wherein the chip further comprising:
    a plurality of off-chip units and a plurality of data path units, wherein the plurality of off-chip units are coupled to each other.

15. The method of claim 14, wherein writing the test data to the first predetermined block of the plurality of blocks through the predetermined pad of the plurality of pads comprises:
    a probe of a probe card writing the test data to the plurality of off-chip units in turn through the predetermined pad according to a boundary scan method, wherein the boundary scan method is that the test data are written to the plurality of off-chip units in turn through a shift registering method; and
    controlling the plurality of off-chip units writing the test data to the first predetermined block of the plurality of blocks through the plurality of data path units.

* * * * *